US011665899B2

(12) United States Patent
Han (10) Patent No.: US 11,665,899 B2
(45) Date of Patent: May 30, 2023

(54) VERTICAL MEMORY DEVICES WITH HIGH DENSITY DUMMY CHANNEL STRUCTURE

(71) Applicant: Yangtze Memory Technologies Co., Ltd., Wuhan (CN)

(72) Inventor: Yuhui Han, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/684,812

(22) Filed: Nov. 15, 2019

(65) Prior Publication Data

US 2021/0050368 A1 Feb. 18, 2021

Related U.S. Application Data

(63) Continuation of application No. PCT/CN2019/100590, filed on Aug. 14, 2019.

(51) Int. Cl.
*H10B 43/27* (2023.01)
*H10B 43/10* (2023.01)
(Continued)

(52) U.S. Cl.
CPC .... *H01L 27/11582* (2013.01); *H01L 27/1157* (2013.01)

(58) Field of Classification Search
CPC ........................ H01L 27/1157; H01L 27/11578
See application file for complete search history.

(56) References Cited

U.S. PATENT DOCUMENTS

| 10,354,740 B2 | 7/2019 | Kim et al. |
| 10,553,598 B2 | 2/2020 | Jung |

(Continued)

FOREIGN PATENT DOCUMENTS

| CN | 108735760 A | 11/2018 |
| CN | 109496356 A | 3/2019 |

(Continued)

OTHER PUBLICATIONS

Combined Chinese Office Action and Search Report dated Jun. 29, 2020 in Patent Application No. 201980001762.4 (with English translation of Categories of Cited Documents), 7 pages.

(Continued)

*Primary Examiner* — Didarul A Mazumder
*Assistant Examiner* — Gustavo G Ramallo
(74) *Attorney, Agent, or Firm* — Oblon, McClelland, Maier & Neustadt, L.L.P.

(57) ABSTRACT

Aspects of the disclosure provide a semiconductor device. The semiconductor device includes a substrate, a plurality of gate layers, and a plurality of insulating layers. The plurality of gate layers and the plurality of insulating layers are stacked alternately over a first region of the substrate and are stacked of a stair-step form over a second region of the substrate. The semiconductor device also includes a channel structure that is disposed over the first region and through the plurality of gate layers and the plurality of insulating layers. The channel structure and the plurality of gate layers form a stack of transistors in a series configuration with the plurality of gate layers being a plurality of gates for the stack of transistors. The semiconductor device also includes a first dummy channel structure that is disposed through a first stair region of the stair-step form, a second dummy channel structure that is disposed through a second stair region of the stair-step form adjacent to the first stair region, and a third dummy channel structure that is disposed at a boundary between the first stair region and the second stair region.

10 Claims, 6 Drawing Sheets

(51) Int. Cl.
    *H01L 27/11582*    (2017.01)
    *H01L 27/1157*     (2017.01)

(56) References Cited

U.S. PATENT DOCUMENTS

| | | | |
|---|---|---|---|
| 2017/0084532 A1* | 3/2017 | Son | H01L 23/5226 |
| 2018/0053768 A1* | 2/2018 | Kim | H01L 27/11575 |
| 2018/0308559 A1* | 10/2018 | Kim | G11C 19/28 |
| 2019/0157282 A1 | 5/2019 | Jung | |
| 2019/0272885 A1 | 9/2019 | Kim et al. | |
| 2020/0119031 A1 | 4/2020 | Shen et al. | |
| 2021/0020657 A1* | 1/2021 | Song | H01L 27/11565 |

FOREIGN PATENT DOCUMENTS

| | | |
|---|---|---|
| CN | 110024126 A | 7/2019 |
| CN | 110246843 A | 9/2019 |
| TW | I667774 B | 8/2019 |

OTHER PUBLICATIONS

International Search Report and Written Opinion dated May 12, 2020 in PCT/CN2019/100590, 10 pages.
Chinese Office Action dated Jun. 2, 2021 in Chinese Patent Application No. 201980001762.4, 4 pages.

\* cited by examiner

VERTICAL MEMORY DEVICES WITH HIGH DENSITY DUMMY CHANNEL STRUCTURE

RELATED APPLICATION

This application is a bypass continuation of International Application No. PCT/CN2019/100590, filed on Aug. 14, 2019. The entire disclosure of the prior application is hereby incorporated by reference in its entirety.

BACKGROUND

Vertical device technologies, such as three dimensional (3D) NAND flash memory technology, and the like can achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in the stair-step form to facilitate forming contact structures to the respective gate layers. The contact structures are used to connect driving circuitry to the respective gate layers for controlling the stacked memory cells.

SUMMARY

Aspects of the disclosure provide a semiconductor device. The semiconductor device includes a substrate, a plurality of gate layers, and a plurality of insulating layers. The plurality of gate layers and the plurality of insulating layers are stacked alternately over a first region of the substrate and are stacked of a stair-step form over a second region of the substrate. The semiconductor device also includes a channel structure that is disposed over the first region and through the plurality of gate layers and the plurality of insulating layers. The channel structure and the plurality of gate layers form a stack of transistors in a series configuration with the plurality of gate layers being a plurality of gates for the stack of transistors. The semiconductor device also includes a first dummy channel structure that is disposed through a first stair region of the stair-step form, a second dummy channel structure that is disposed through a second stair region of the stair-step form adjacent to the first stair region, and a third dummy channel structure that is disposed at a boundary between the first stair region and the second stair region.

According to aspects of the disclosure, the semiconductor device further includes a fourth dummy channel structure that is disposed through the first stair region of the stair-step form, and a fifth dummy channel structure that is disposed through the second stair region of the stair-step form. The first dummy channel structure and the second dummy channel structure are disposed in a first row, the fourth dummy channel structure and the fifth dummy channel structure are disposed in a second row, and the third dummy channel structure is disposed between the first row and the second row.

According to aspects of the disclosure, the semiconductor device further includes a first contact structure that is disposed over the first stair region at a distance from the third dummy channel structure that is greater than a distance between the first dummy channel structure and the first contact structure, and a second contact structure that is disposed over the second stair region at a distance from the third dummy channel structure that is greater than a distance between the second dummy channel structure and the second contact structure. The first contact structure and the second contact structure are conductively connected to a first gate layer and a second gate layer in the plurality of gate layers, respectively. The third dummy channel structure is disposed between the first contact structure and the second contact structure.

In some embodiments, a minimum distance between each dummy channel structure and each contact structure is greater than or equal to a first limit.

In some embodiments, a maximum distance between two neighboring dummy channel structures is less than or equal to a second limit.

In some embodiments, the channel structure and the third dummy channel structure are formed of a same material.

In some embodiments, the third dummy channel structure has a circular shape.

Aspects of the disclosure provide a method of manufacturing a semiconductor device. The method stacks a plurality of dummy gate layers and a plurality of insulating layers alternately over a first region and a second region of a substrate of the semiconductor device, forms the stacked dummy gate layers and insulating layers into a stair-step form over the second region of the substrate, and forms a channel structure over the first region and dummy channel structures over the second region of the substrate. The dummy channel structures includes a first dummy channel structure disposed through a first stair region of the stair-step form, a second dummy channel structure disposed through a second stair region of the stair-step form adjacent to the first stair region, and a third dummy channel structure disposed at a boundary between the first stair region and the second stair region.

In some embodiments, the stair-step form of the stacked dummy gate layers and insulating layers over the second region is formed using a trim etching technique.

In some embodiments, the first dummy channel structure and the second dummy channel structure are adjacent to the boundary between the first stair region and the second stair region.

According to aspects of the disclosure, the method further replaces the plurality of dummy gate layers with a plurality of gate layers, and forms contact structures over the second region of the substrate to conductively connect the plurality of gate layers. The contact structures include a first contact structure and a second contact structure conductively connected to a first gate layer and a second gate layer in the plurality of gate layers, respectively.

In some embodiments, the first contact structure is disposed over the first stair region of the stair-step form at a distance from the third dummy channel structure that is greater than a distance between the first dummy channel structure and the first contact structure, and the second contact structure is disposed over the second stair region of the stair-step form at a distance from the third dummy channel structure that is greater than a distance between the second dummy channel structure and the second contact structure.

In some embodiments, a minimum distance between each dummy channel structures and each contact structures is greater than or equal to a first limit.

In some embodiments, a maximum distance between two neighboring dummy channel structures is less than or equal to a second limit.

In some embodiments, the channel structure and the third dummy channel structure are formed of a same material.

In some embodiments, the third dummy channel structure has a circular shape.

Aspects of the disclosure provide a method for designing a layout for a semiconductor device. The method disposes a stack of alternating gate layers and insulating layers in a first region and a second region of the layout. The stack of alternating gate layers and insulating layers is of a stair-step form in the second region. The method further disposes, in the second region of the layout, a first dummy channel structure through a first stair region of the stair-step form, a second dummy channel structure through a second stair region of the stair-step form adjacent to the first stair region, and a third dummy channel structure at a boundary between the first stair region and the second stair region.

According to aspects of the disclosure, the method disposes, in the first region of the layout, a channel structure through the stack of alternating gate layers and insulating layers. The method further disposes, in the second region of the layout, a first contact structure in the first stair region of the stair-step form and adjacent to the first dummy channel structure, and a second contact structure in the second stair region of the stair-step form and adjacent to the second dummy channel structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to aspects of the disclosure, a vertical memory device (e.g., 3D NAND memory) may include a core region over a first region of a substrate of the memory device. The core region is, for example, a stack of gate layers and insulating layers (e.g., alternating gate layers and insulating layers) over the first region of the substrate of the memory device. The stack of gate layers and insulating layers can extend to a second region of the substrate. The stack of gate layers and insulating layers over the second region of the substrate is of a stair-step form and can also be referred to as a staircase region.

The vertical memory device also includes a channel structure that is disposed over the first region. The channel structure can be one of a plurality of channel structures in first region. The channel structure extends through the gate layers and insulating layers in order to form a stack of transistors in a series configuration with the gate layers being gates of the stack of transistors. The stack of transistors forms a memory cell string of the vertical memory device. The memory cell string includes, for example, a plurality of memory cells, a string selection transistor, and a ground selection transistor that are disposed in series in a vertical direction with respect to a main surface of the substrate. Each memory cell can store data.

Various fabrication technologies, such as gate-first fabrication technology, gate-last fabrication technology, and the like can be used to fabricate vertical memory devices. The gate-first fabrication technology forms gates of memory cells earlier than channel structures of the memory cells. The gate-last fabrication technology uses sacrificial layers (also referred to as dummy gate layers) to facilitate a formation of the channel structures of the memory cells, and replaces the sacrificial layers with the gates of the memory cells after the formation of the channel structures. To replace the sacrificial layers with the gates, the sacrificial layers are removed and the gate layers are subsequently formed. When the sacrificial layers are removed, the channel structures of the memory cells in a core region can provide support to prevent the core region from collapse. Similar to the channel structures in the core region, dummy channel structures in a staircase region can provide support to prevent the staircase region from collapse when the sacrificial layers are removed, for example during or after removal of the sacrificial layers.

As data storage density improves, a number of layers used in the stack of gate layers and insulating layers can increase, and thus the stack can be relatively thick. However, it can be challenging to successfully form the dummy channel structures in a thick film structure. Due to an etch loading effect that is a relationship between an etch rate of an etch process and an exposed area to be etched, a dummy channel structure in the thick film structure may be under etched and a dummy channel hole for etching the dummy channel structure may not be completely opened in some cases, for example when a dummy channel structure is in a less dense area.

Aspects of the disclosure provide layout designs for the dummy channel structures in the staircase regions. The layout designs satisfy certain distance requirements in order to support the staircase regions when the sacrificial gates are removed. Further, the present disclosure provides techniques to improve density of the dummy channel structures in the layout designs, for example to alleviate influences of etch loading effect when etching dummy channel holes for the dummy channel structures.

Figure 1A:
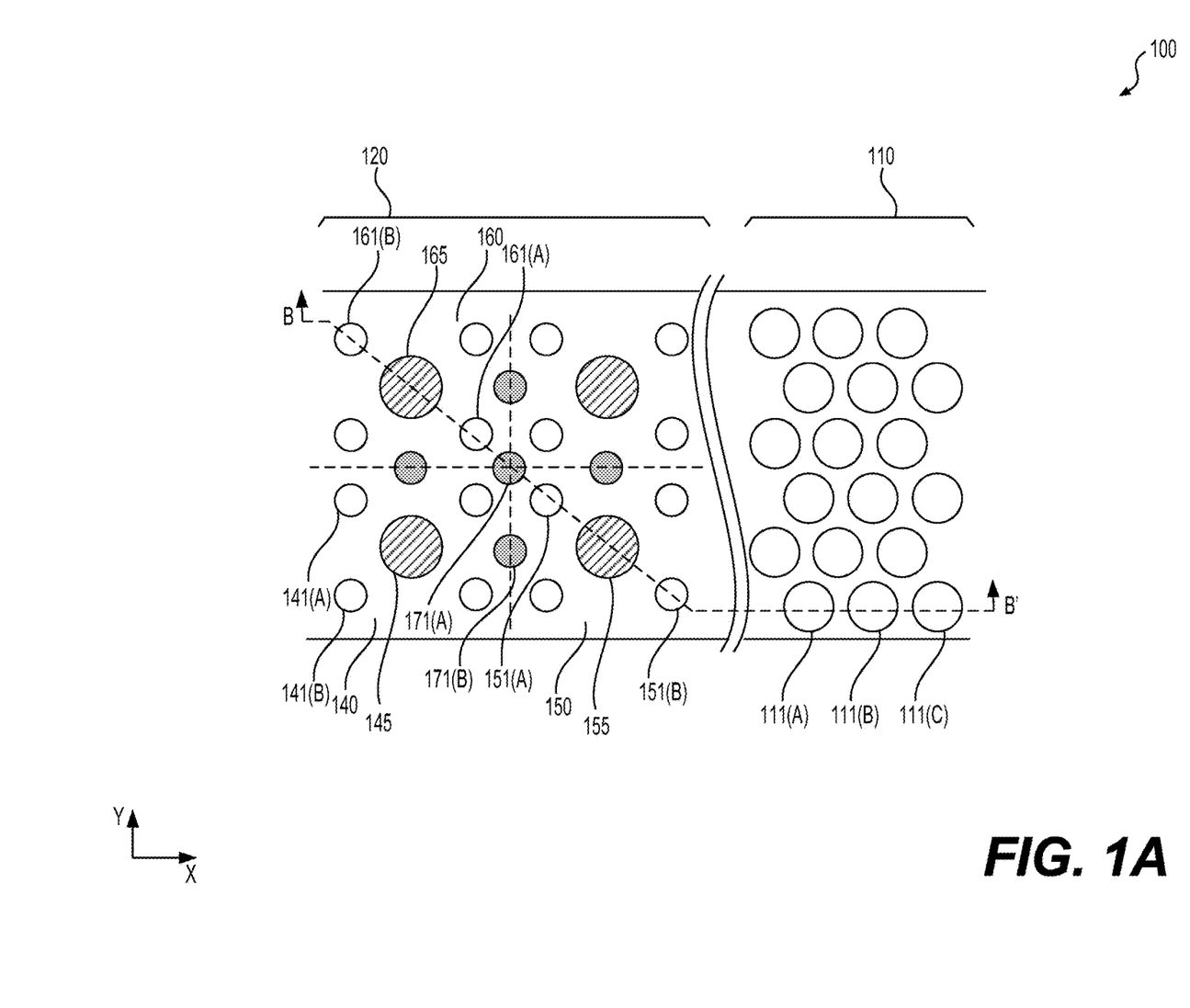
FIGS. 1A and 1B show a horizontal cross-sectional view and a vertical cross-sectional view of a semiconductor device according to some embodiments the disclosure.
Figure 1B:
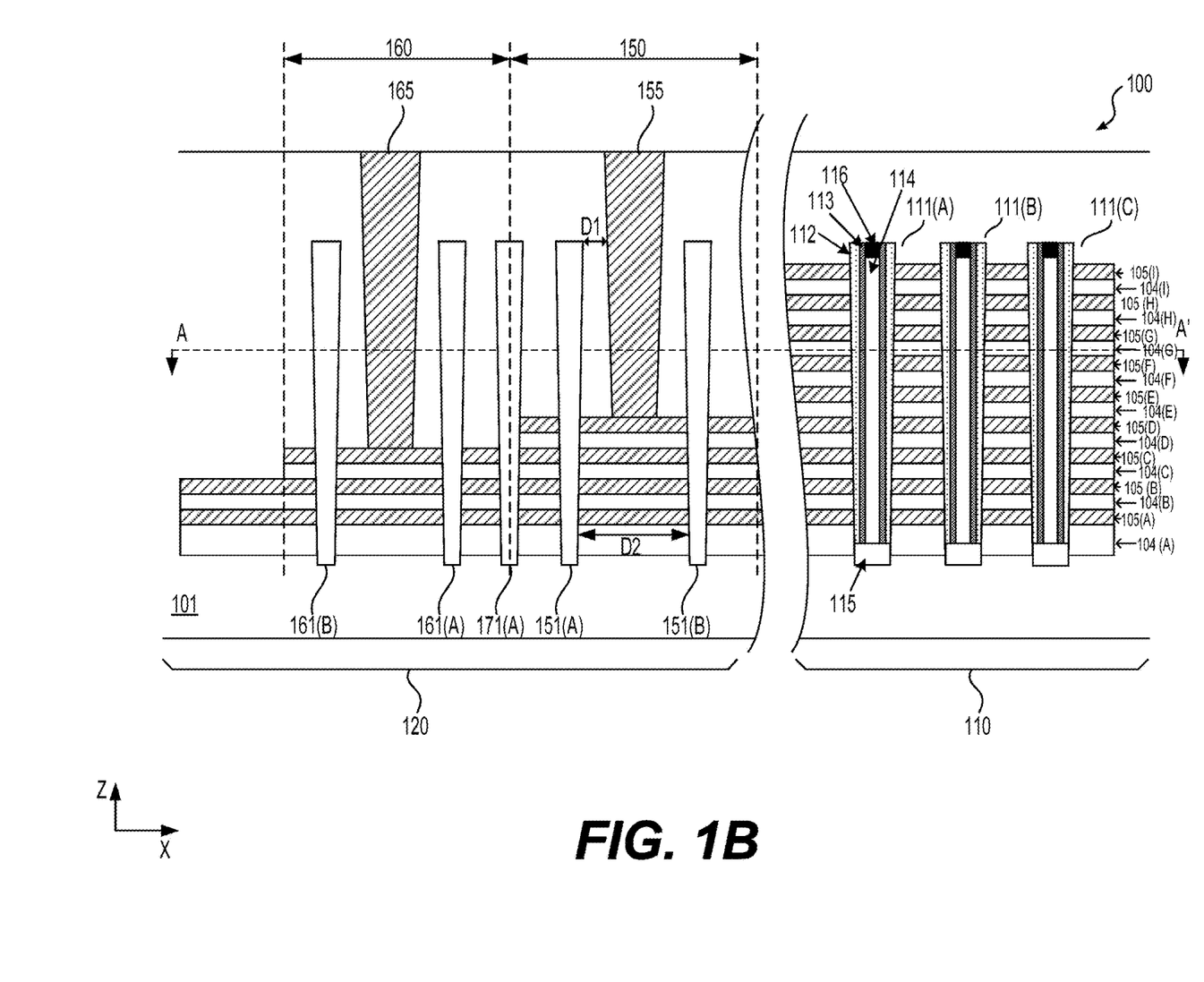

FIG. 1A shows a horizontal cross-sectional view and FIG. 1B shows a vertical cross-sectional view of an exemplary semiconductor device 100 in accordance with some embodiments of the disclosure. The exemplary semiconductor device 100 includes a substrate 101, and circuits formed on the substrate 101. A main surface of the substrate 101 extends for example in the X direction and the Y direction. The horizontal cross-section (e.g., an X-Y plane) is parallel to the main surface of the substrate 101, and the vertical cross-section (e.g., an X-Z plane) is perpendicular to the main surface of the substrate 101. FIG. 1A shows a line B-B' for generating the vertical cross-sectional view in FIG. 1B; and FIG. 1B shows a line A-A' for generating the horizontal cross-sectional view in FIG. 1A.

The exemplary semiconductor device 100 can be any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like. The substrate 101 can be any suitable substrate, such as a silicon (Si) substrate, a germanium (Ge) substrate, a silicon-germanium (SiGe) substrate, and/or a silicon-on-insulator (SOI) substrate. The substrate 101 may include a semiconductor material, for example, a Group IV semiconductor, a Group III-V compound semiconductor, or a Group II-VI oxide semiconductor. The Group IV semiconductor may include Si, Ge, or SiGe. The substrate 101 may be a bulk wafer or an epitaxial layer.

In various embodiments, the exemplary semiconductor device 100 includes three dimensional (3D) NAND memory circuitry formed on the substrate 101. The exemplary semiconductor device 100 can include other suitable circuitry (not shown), such as logic circuitry, power circuitry, and the like that is formed on the substrate 101, or other suitable substrate, and is suitably coupled with the 3D NAND memory circuitry. Generally, the 3D NAND memory circuitry includes a memory array and peripheral circuitry (e.g., an address decoder, driving circuits, sense amplifier, and/or the like). The memory array is formed in a core region 110 as an array of vertical memory cell strings. The peripheral circuitry is formed in a peripheral region (not shown). Besides the core region 110 and the peripheral region, the exemplary semiconductor device 100 includes a staircase region 120 in which contact structures to the gates of the memory cells in the vertical memory cell strings are disposed. The gates of the memory cells in the vertical memory cell strings correspond to word lines for the NAND memory architecture.

Specifically, in the FIG. 1A and FIG. 1B example, the core region 110 of the exemplary semiconductor device 100 includes gate layers 105 (e.g., 105(A)-105(I)) and insulating layers 104 (e.g., 104(A)-104(I)) that are stacked alternatingly to form a stack of transistors. However, other sequences or combinations of the gate layers and insulating layers can be utilized.

In some examples, the stack of transistors includes memory cells and select transistors, such as a ground select transistor, a string select transistor, and the like. The gate layers 105 correspond to gates of the transistors. In an example, the gate layer 105(A) corresponds to a gate of a ground select transistor, the gate layer 105(I) corresponds to a gate of a string select transistor, and the other gate layers 105(B)-105(H) correspond to the gates of memory cells that are stacked vertically with the ground select transistor and the string select transistor. The gate layers 105(B)-105(H) can also be referred to as word lines in a memory architecture. The gate layers 105 can include one or more gate stack material(s), such as high dielectric constant (high-k) gate insulator layers, a metal gate (MG) electrode, and the like. The insulating layers 104 are made of insulating material(s), such as silicon nitride, silicon dioxide, and/or the like.

In the core region 110, a plurality of channel structures 111 (e.g., 111(A)-111(C)) are formed. In some embodiments, each of the plurality of channel structures 111 has a pillar shape that extends in the Z direction that is perpendicular to the direction of the main surface of the substrate 101. The plurality of channel structures 111 can be disposed separate from each other along the X direction and the Y direction, and can be disposed in some suitable array shape, such as a matrix array shape along the X direction and the Y direction, a zig-zag array shape along the X or Y direction, a beehive (e.g., hexagonal) array shape, and/or the like. In some embodiments, each of the plurality of channel structures 111 has a circular shape in the X-Y plane, and a pillar shape in the X-Z plane.

In some embodiments, each of the plurality of channel structures 111 is formed by a plurality of materials. For example, each of the plurality of channel structures 111 includes a gate dielectric layer 112, a semiconductor layer 113, and an insulating layer 114. These materials can also have the circular shape in the X-Y plane, and extend in the Z direction. The gate dielectric layer 112 is formed on the sidewall of the channel structure 111, and includes multiple layers, such as a tunnel insulating layer (e.g., silicon oxide), a charge storage layer (e.g., silicon nitride), and a blocking insulating layer (e.g., silicon oxide) that are sequentially stacked from the sidewall. In an example, the gate dielectric layer 112 has an oxide-nitride-oxide (ONO) stack structure. The semiconductor layer 113 can be any suitable semiconductor material, such as polysilicon or monocrystalline silicon, and the semiconductor material may be un-doped or may include a p-type or n-type dopant. The insulating layer 114 is formed of an insulating material, such as silicon oxide and/or silicon nitride, and/or may be formed as an air gap.

The channel structures 111 include other suitable components. For example, each channel structure 111 includes a first end structure 115 and a second end structure 116. In some embodiments, the first end structures 115 and the second end structures 116 are formed of any suitable semiconductor material, such as polysilicon or monocrystalline silicon, and the semiconductor material may be un-doped or may include a p-type or n-type dopant. In an example, the first end structure 115 is the source of the ground select transistor, and the second end structure 116 is the drain of the string select transistor.

Further, in the FIG. 1A and FIG. 1B example, the stack of the gate layers 105 and insulating layers 104 extends into the staircase region 120 of the exemplary semiconductor device 100. The staircase region 120 includes a plurality of stair regions (e.g., stair regions 140, 150, and 160) to facilitate forming a plurality of contact structures (e.g., contact structures 145, 155, and 165) to the gate layers 105. The plurality of contact structures are used to connect driving circuitry, such as word line driving circuitry, ground select driving circuitry, string select driving circuitry, and the like in the periphery circuitry to the respective gates of the transistors in the stack.

It is noted that the stair regions 140, 150, and 160 can include the same or different numbers of stacked gate layers and insulating layers. In an example, the stair regions 140, 150, and 160 include the same number of stacked gate layers and insulating layers. In another example, the stair regions 140 and 150 include the same number of stacked gate layers and insulating layers but the stair region 160 includes a different number of stacked gate layers and insulating layers. In another example, the stair regions 140 and 160 include the same number of stacked gate layers and insulating layers but the stair region 150 includes a different number of stacked gate layer and insulating layers. In the FIG. 1A and FIG. 1B example, the stair regions 150 and 160 include different numbers of stacked gate layers and insulating layers, but the stair region 140 is not limited to including the same or a different number of stacked gate layers and insulating layers.

In some examples, the top portions of the stack are selectively removed at different stair regions of the staircase region 120. In the FIG. 1A and FIG. 1B example, at the stair region 150, the top portion of the stack that is above the gate layer 105(D) is removed; at the stair region 160, the top portion of the stack that is above the gate layer 105(C) is removed. Thus, contact holes for forming the contact structures 155 and 165 can be formed by a single etch process. The etch process is configured to stop at, for example, the respective top gate layer for each of the stair regions. That is, the contact hole for the stair region 150 stops at the gate layer 105(D); and the contact hole for the stair region 160 stops at the gate layer 105(C). When the contact holes are filled with metal to form the contact structures 155 and 165, the contact structure 155 is conductively connected with the gate layer 105(D) and the contact structure 165 is conductively connected with the gate layer 105(C).

According to aspects of the disclosure, a plurality of dummy channel structures is formed through different stair regions of the staircase region 120 to support the staircase region 120 from collapse when the sacrificial layers are removed. Referencing to FIG. 1A, dummy channel structures 141 (e.g., dummy channel structures 141(A) and 141(B)) are formed around the contact structure 145 through the stair region 140, dummy channel structures 151 (e.g., dummy channel structures 151(A) and 151(B)) are formed around the contact structure 155 through the stair region 150, and dummy channel structures 161 (e.g., dummy channel structures 161(A) and 161(B)) are formed around the contact structure 165 through the stair region 160.

In some embodiments, the layout of dummy channel structures and contact structures satisfies certain distance requirements. In an embodiment, a minimum distance between a contact structure and a dummy channel structure adjacent to the contact structure is greater than or equal to a first distance. The first distance may be predetermined to prevent overlap between the dummy channel structure and the adjacent contact structure. In the FIG. 1A and FIG. 1B example, a minimum distance between the contact structure 155 and the dummy channel structure 151(A) (or dummy channel structure 151(B)) is greater than or equal to a distance D1.

In some related examples, to avoid under etch for the dummy channel structures 141, 151, and 161 and the like in the staircase region 120, a hole area (e.g., corresponding to a diameter) of a dummy channel hole is enlarged. However, when a distance between a contact structure and a dummy channel structure adjacent to the contact structure is kept to be a constant distance, e.g., an allowed minimum distance D1, an enlarged dummy channel hole area of the dummy channel structure can result in a smaller contact hole area of the contact structure, and thus cause a higher contact resistance and a higher risk of break down. For example, the distance between the dummy channel structure 151(A) and the contact structure 155 is kept to be the allowed minimum distance D1, thus enlarging the dummy channel hole area of the dummy channel structure 151(A) can result in a smaller contact hole area of the contact structure 155.

According to aspects of the disclosure, additional dummy channel structures are disposed through the staircase region in addition to the dummy channel structures around the contact structures to support the staircase region and avoid under etch due to etch loading effect.

In some embodiments, the additional dummy channel structures are disposed between two adjacent stair regions of the staircase region. In an embodiment, a first existing dummy channel structure and a second existing dummy channel structure are disposed through a first stair region and a second stair region of the staircase region, respectively, and an additional dummy channel structure is disposed at a boundary between the first stair region and the second stair region. For example, the additional dummy channel structure intersects the boundary. The second stair region is adjacent to the first stair region in the stair-step form of the staircase region.

In the FIG. 1A and FIG. 1B example, the first existing dummy channel structure 151(A) is disposed through the first stair region 150, the second existing dummy channel structure 161(A) is disposed through the second stair region 160 that is adjacent to the first stair region 150, and the additional dummy channel structure 171(A) is disposed at the boundary between the first stair region 150 and the second stair region 160. Therefore, by adding an additional dummy channel structure, the density of the dummy channel structures in a stair region can be improved without shrinking the contact hole area of the contact structure in the stair region.

However, it is noted that the additional dummy channel structure may not be exactly at the boundary between two different stair regions due to process variation. In a process with a large process variation, the additional dummy channel structure may be disposed closer to one of the two different stair regions. In some embodiments, the additional dummy channel structure is disposed in one of the two different stair regions but within a predetermined distance of the boundary.

In some embodiments, the additional dummy channel structures are disposed alternately with the contact structures in a row between a first row and a second row of existing dummy channel structures in the staircase region. In an embodiment, the first row and the second row of existing dummy channel structures are aligned to each other, and the row of alternating additional dummy channel structures and the contact structures is disposed in an offset manner with the first row and/or the second row of the existing dummy channel structures.

In the FIG. 1A and FIG. 1B example, the first row of dummy channel structures is a row including the existing dummy channel structures 141(A) and 151(A) and the second row of dummy channel structures is a row including the existing dummy channel structures 141(B) and 151(B). Thus, an additional dummy channel structure 171(B) can be disposed between two contact structures 145 and 155. It is noted that if the stair regions 140 and 150 are on a same level of the stair-step, the additional dummy channel structure 171(B) is disposed in the same level as the existing dummy channel structures 141 and 151. However, if the stair regions 140 and 150 are different levels of the stair-step, the additional dummy channel structure 171(B) may be disposed at the boundary between the stair regions 140 and 150.

In FIG. 1A, the existing dummy channel structures 141, 151, and 161 are arranged to have a symmetric pattern with regard to the contact structures 145, 155, and 165. It is noted that the existing dummy channel structures 141, 151, and 161 and the like can be arranged to have a symmetric pattern or a non-symmetric pattern with regard to the contact structures 145, 155, and 165. In addition, each contact structure has four adjacent existing dummy channel structures in FIG. 1A. However, the number of adjacent channel structures for a contact structure is not limited in the disclosure as long as a maximum sustained distance requirement is met for the dummy channel structures. The maximum sustained distance requirement limits a maximum distance between two dummy channel structures to support the staircase region within the maximum sustained distance. In an example, the maximum sustained distance requirement requires the maximum distance between two dummy channel structures to be less than or equal to a second limit. The second limit may be predetermined to ensure sufficient support without collapse. In the FIG. 1A and FIG. 1B example, the maximum distance between the two dummy channel structures is D2. Further, a shape of a dummy channel hole is not limited in the disclosure, although the dummy channel holes in FIG. 1A have a circular shape.

According to aspects of the disclosure, a gate-last process is used to form the exemplary semiconductor device 100, and dummy channel structures (e.g., dummy channel structures 151, 161, and 171) are formed in the staircase region 120 to support the staircase region 120. During the gate-last process, initially, sacrificial layers (not shown in FIG. 1B and will be shown in FIG. 5) are used in the place of the gate layers 105, thus the initial stack includes the sacrificial layers and the insulating layers 104 that are alternatingly deposited on the substrate 101 in the core region 110 and the staircase region 120. Further, the stair-steps are formed in the staircase region 120, for example by selectively removing the top portions of the stack at different stair-steps. In an example, the stair-steps are formed by trim-and-etch procedures. Then, the channel structures 111 are formed in the core region 110 and the dummy channel structures 151, 161, and 171 are formed in the staircase region 120.

Further, the sacrificial layers are replaced by the gate layers 105 to form gates of the transistors in the core region 110. In an example, gate line slits (GLS) are etched as trenches in the stack. Etchants to the sacrificial layers are applied via the GLS to remove the sacrificial layers. In an example, the sacrificial layers are made of silicon nitride, and the hot sulfuric acid ($H_2SO_4$) is applied via the GLS to remove the sacrificial layers. Further, via the GLS, the gates of the transistors in the core regions are formed. In an example, the gates are formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

It is noted that, when the sacrificial layers are removed, the channel structures 111 support the stack of the insulating layers 104 in the core region 110, and the dummy channel structures 151, 161, and 171 and the like support the stack of insulating layers 104 in the staircase region 120.

In an embodiment, the dummy channel structures 151, 161, and 171 and the like are formed with the channel structures 111, and thus the dummy channel structures 151, 161, and 171 and the like are formed of the same material as the channel structures 111. In another embodiment, the dummy channel structures 151, 161, and 171 and the like are formed of different materials from the channel structures 111, for example using a mask layer to differentiate the core region 110 and the staircase region 120.

Figure 2:
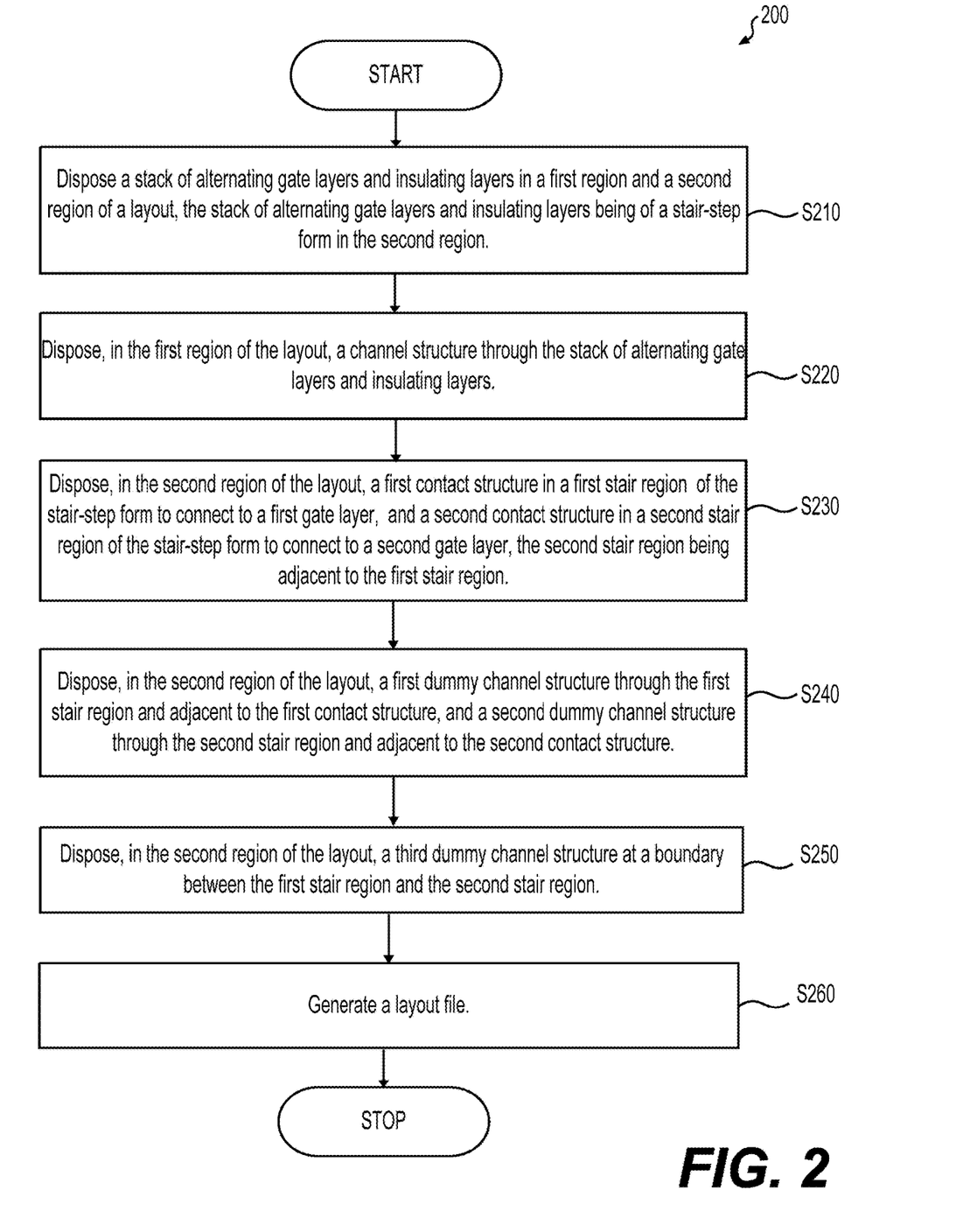
FIG. 2 shows a flowchart outlining an exemplary layout design process for fabricating the semiconductor according to some embodiments of the disclosure.

FIG. 2 shows a flowchart outlining an exemplary process 200 according to an embodiment of the disclosure. The process 200 is used to generate a layout design for semiconductor device (e.g., a 3D NAND memory device), and then fabricate semiconductor devices according to the layout design. The process 200 starts and proceeds to S210.

At S210, the process 200 disposes a stack of alternating gate layers and insulating layers in a first region and a second region of a layout. The stack of alternating gate layers and insulating layers is disposed in a stair-step form in the second region.

In the FIG. 1A and FIG. 1B example, the stack of alternating gate layers 105 and insulating layers 104 are disposed in the first region 110 and the second region 120. The second region 120 is of a stair-step form.

At S220, the process 200 disposes, in the first region of the layout, a channel structure through the stack of alternating gate layers and insulating layers. The channel structure and the gate layers form a stack of transistors with the gate layers being gates of the transistors. The stack of transistors can be used as memory cells of the memory device to store data. The stack of transistors also includes ground selection transistors and string selection transistors and the like.

In the FIG. 1A and FIG. 1B example, the channel structures 111 are disposed in the first region 110 through the stack of alternating gate layers 105 and insulating layers 104.

At S230, the process 200 disposes, in the second region of the layout, a first contact structure in a first stair region of the stair-step form to connect to a first gate layer, and a second contact structure in a second stair region of the stair-step form to connect to a second gate layer. The second stair region is adjacent to the first stair region.

In the FIG. 1A and FIG. 1B example, the first contact structure 155 is disposed in the first stair region 150 to connect the first gate layer 105(D), and the second contact structure 165 is disposed in the second stair region 160 to connect the second gate layer 105(C). The second stair region 160 is adjacent to the first stair region 150.

At S240, the process 200 disposes, in the second region of the layout, a first dummy channel structure through the first stair region and adjacent to the first contact structure, and a second dummy channel structure through the second stair region and adjacent to the second contact structure. In an embodiment, a minimum distance between one of the dummy channel structures and one of the contact structures adjacent to the one of the dummy channel structures is greater than or equal to a first limit. In addition, a maximum distance between two of the dummy channel structures is less than or equal to a second limit. The first limit and the second limit may be predetermined according to a process rule.

In the FIG. 1A and FIG. 1B example, the first dummy channel structure 151(A) is disposed through the first stair region 150 and adjacent to the first contact structure 155, and the second dummy channel structure 161(A) is disposed through the second stair region 160 and adjacent to the second contact structure 165. The minimum distance between the first contact structure 155 and the first dummy channel structure 151(A) is D1. The maximum distance between the first contact structures 151(A) and 151(B) is D2. Both D1 and D2 are predetermined according to a process rule.

At S250, the process 200 disposes, in the second region of the layout, a third dummy channel structure at a boundary between the first stair region and the second stair region.

In the FIG. 1A and FIG. 1B example, the third dummy channel structure 171(A) is disposed at the boundary between the first stair region 150 and the second stair region 160. As described above, it is noted that the third dummy channel may not be exactly disposed at the boundary due to a large process variation. Instead, the third dummy channel may be disposed closer to one of the two stair regions.

At S260, the process 200 generates a layout file according to the disposed structures. The layout can have many layers, such as a channel layer for defining channel structures in the first region and dummy channel structures in the second region, a contact layer for defining contact structures in the second region, and the like. Then the process 200 terminates.

In some embodiments, the layout file is used to fabricate semiconductor devices, such as the exemplary semiconductor device 100. In an example, a set of masks is generated according to the layout file. Then, the set of masks is used in a gate-last process to fabricate the exemplary semiconductor device 100.

Figure 3:
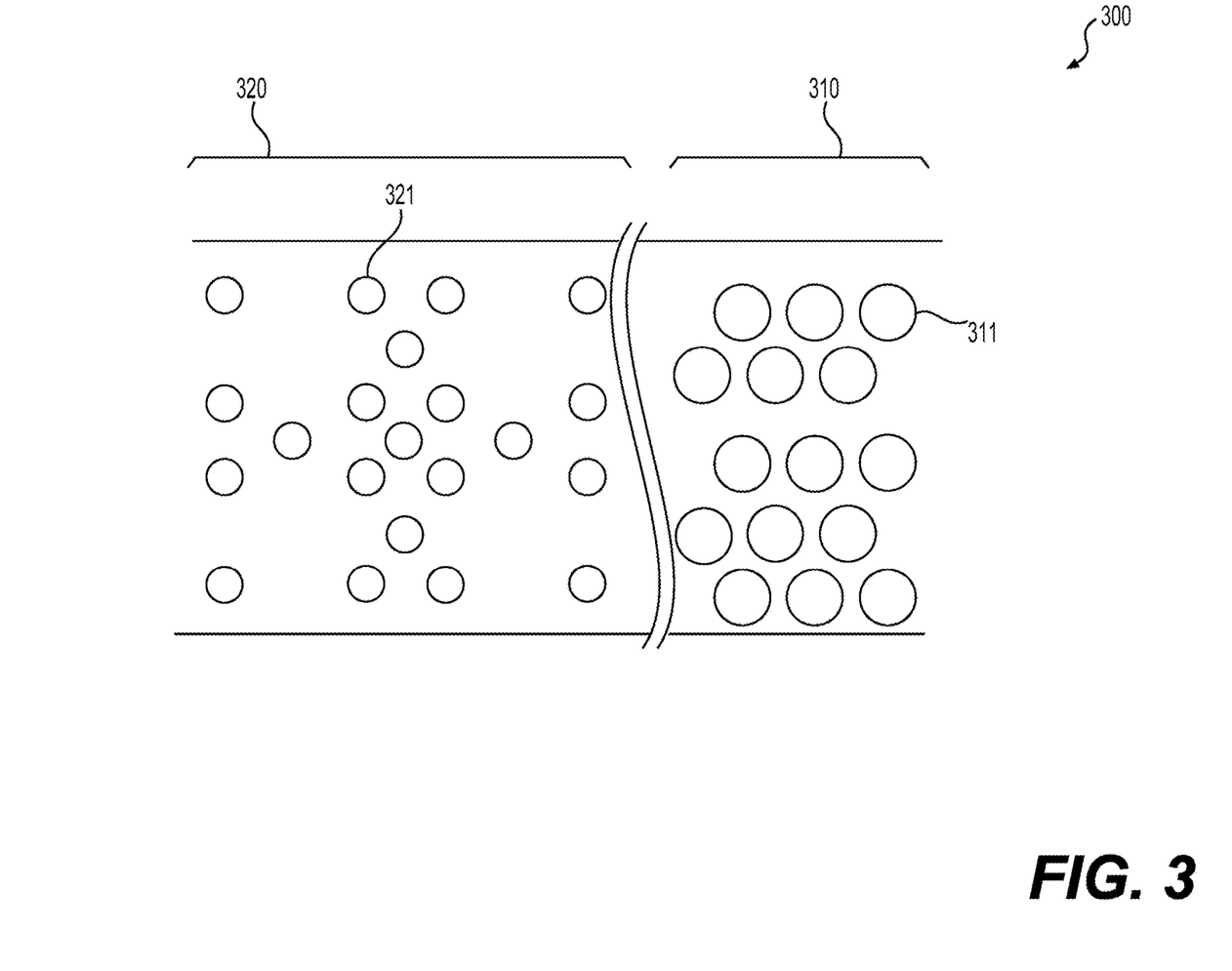
FIG. 3 shows an exemplary mask for fabricating the semiconductor device according to some embodiments of the disclosure.

FIG. 3 shows an exemplary mask 300 according to some embodiments of the disclosure. The mask 300 is generated according to a channel layer in a layout. The mask 300 includes a core area 310 corresponding to the core region 110 and a staircase area 320 corresponding to the staircase region 120. The core area 310 includes a plurality of circular shapes 311 that define the shapes of channel holes and channel structures. The staircase area 320 includes a plurality of circular shapes 321 that define the shapes of dummy channel holes and dummy channel structures. The mask 300 is used to create channel holes in the core region 110 and the dummy channel holes in the staircase region 120.

Figure 4:
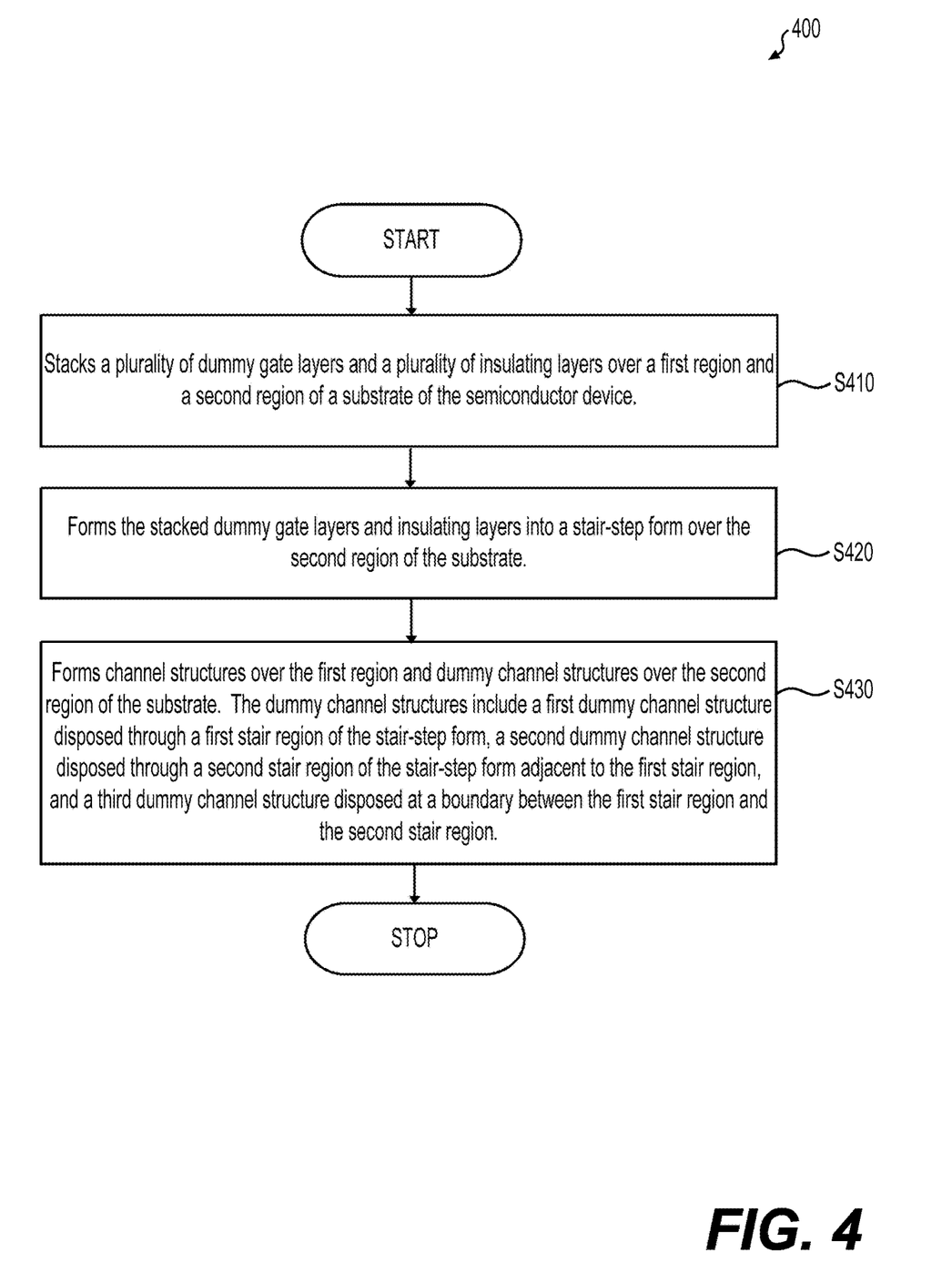
FIG. 4 shows a flowchart outlining an exemplary manufacturing process for fabricating the semiconductor device according to some embodiments of the disclosure.

FIG. 4 shows a flowchart outlining an exemplary process 400 according to some embodiments of the disclosure. The process 400 is used to manufacture a semiconductor device during a gate-last process according to a set of masks. The process 400 starts and proceeds to S410.

At S410, the process 400 stacks a plurality of dummy gate layers and a plurality of insulating layers over a first region and a second region of a substrate of the semiconductor device. The plurality of dummy gate layers and the plurality of insulating layers are alternately stacked in some embodiments.

At S420, the process 400 forms the stacked dummy gate layers and insulating layers into a stair-step form over the second region of the substrate. In an embodiment, the stair-step form of the stacked dummy gate layers and insulating layers over the second region is formed using a trim etching technique.

At S430, the process 400 forms channel structures over the first region and dummy channel structures over the second region of the substrate. The dummy channel structures include a first dummy channel structure disposed through a first stair region of the stair-step form, a second dummy channel structure disposed through a second stair region of the stair-step form adjacent to the first stair region, and a third dummy channel structure disposed at a boundary between the first stair region and the second stair region. The first and second stair regions may correspond to different levels of the stair-step. Then the process 400 terminates.

In an embodiment, the first dummy channel structure and the second dummy channel structure are disposed adjacent to the boundary between the first stair region and the second stair region.

In some embodiments, the process 400 replaces the plurality of dummy gate layers with a plurality of gate layers, and forms contact structures over the second region of the substrate to conductively connect the plurality of gate layers.

In an embodiment, the contact structures include a first contact structure and a second contact structure conductively connected to a first gate layer and a second gate layer in the plurality of gate layers, respectively.

In an embodiment, the first contact structure is disposed over the first stair region of the stair-step form and adjacent to the first dummy channel structure, and the second contact structure is disposed over the second stair region of the stair-step form and adjacent to the second dummy channel structure.

In an embodiment, a minimum distance between each dummy channel structure and each contact structure is greater than or equal to a first limit.

In an embodiment, a maximum distance between two neighboring dummy channel structures is less than or equal to a second limit.

In an embodiment, the channel structure and the dummy channel structures are formed of a same material.

In an embodiment, one of the dummy channel structures is formed to have a circular shape.

Figure 5:
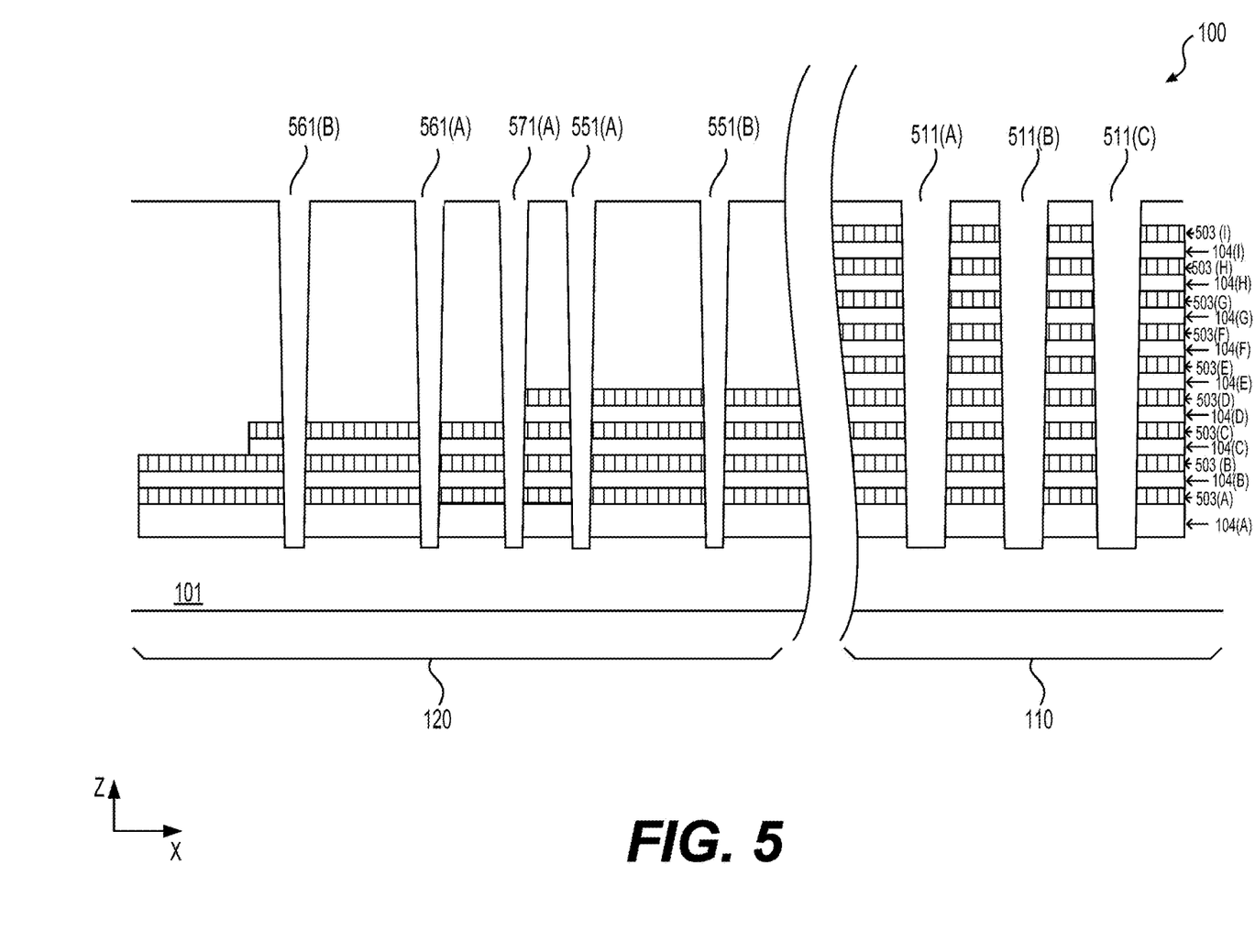
FIG. 5 shows a horizontal cross-sectional view of the semiconductor device during a fabrication process according to some embodiments of the disclosure.

FIG. 5 shows a horizontal cross-sectional view of the exemplary semiconductor device 100 during a gate-last process after a channel etch process according to some embodiments of the disclosure. The channel etch process generates channel holes and dummy channel holes according to the mask 300 in an example. The horizontal cross-sectional view is generated according to the line A-A' in FIG. 1B.

During the gate-last process, initially, sacrificial layers (also referred to as dummy gate layers) 503 (e.g., 503(A)-503(I)) are used in the place of the gate layers 105, thus the initial stack includes the sacrificial layers 503 and the insulating layers 104 that are alternately deposited on the substrate 101 in the core region 110 and the staircase region 120. Further, the stair-steps are formed in the staircase region 120, for example by selectively removing the top portions of the stack at different stair-steps. In an example, suitably planarization process is performed to obtain a relatively flat surface.

Then, photo lithography technology can be used to define patterns in photoresist and/or hard mark layers according to the mask 300, and an etch technology can be used to transfer the patterns into the stack of sacrificial layers 503 and insulating layers 105. Thus, channel holes 311 are formed in the core region 110 and the dummy channel holes 551, 561, and 571 are formed in the staircase region 120.

Then, channel structures are formed in the channel holes, and dummy channel structures are formed in the dummy channel holes. In some embodiments, dummy channel structures can be formed with the channel structures, thus the dummy channel structures are formed of the same materials as the channel structures. In some embodiments, the dummy channel structures are formed of different materials from the channel structures.

In an example, the channel structures 111 and the dummy channel structures 151, 161, and 171 are formed. The channel structures 111 are formed in the core region 110 and the dummy channel structures 151, 161, and 171 are formed in the staircase region 120. In some embodiments, dummy channel structures 151, 161, and 171 can be formed of the same material as the channel structures 111. In some embodiments, dummy channel structures 151, 161, and 171 can be formed of different materials from the channel structures 111.

In some embodiments, a gate line slit (GLS) is used to replace the sacrificial layers 503 with the gate layers 105. In an example, the GLS is etched as a trench in the stack. Etchants to the sacrificial layers are applied via the GLS to remove the sacrificial layers. The sacrificial layers may be made of silicon nitride, and the hot sulfuric acid ($H_2SO_4$) is applied via the GLS to remove the sacrificial layers. Further, via the GLS, gate stacks to the transistors in the core regions are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

The gate-last process continues to, for example, fill the GLS with spacer material (e.g., silicon oxide) and common source material (e.g., tungsten) to form the contact structures 145, 155, and 165 and the like, and to form metal traces and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a plurality of gate layers and a plurality of insulating layers that are stacked alternately over a first region of the substrate, the plurality of gate layers and the plurality of insulating layers being stacked of a stair-step form over a second region of the substrate;
a channel structure that is disposed over the first region and through the plurality of gate layers and the plurality of insulating layers, and the channel structure and the plurality of gate layers forming a stack of transistors in a series configuration with the plurality of gate layers being a plurality of gates for the stack of transistors;
a first dummy channel structure that is disposed through a first stair region of the stair-step form;
a first contact structure that is disposed over the first stair region;
a second dummy channel structure that is disposed through a second stair region of the stair-step form, the second stair region being immediately next to the first stair region in a cross section of the semiconductor device;
a second contact structure that is disposed over the second stair region; and
a third dummy channel structure that is disposed at a boundary between the first stair region and the second stair region,
wherein the first dummy channel structure, the second dummy channel structure, the third dummy channel structure, the first contact structure, and the second contact structure are disposed along a common line in a planar view of the semiconductor device and the first dummy channel structure, the second dummy channel structure, and the third dummy channel structure are disposed between the first contact structure and the second contact structure, the second contact structure being a contact structure that is immediately adjacent to the first contact structure along the common line in the planar view of the semiconductor.

2. The semiconductor device of claim 1, further comprising:
a fourth dummy channel structure that is disposed through the first stair region of the stair-step form; and
a fifth dummy channel structure that is disposed through the second stair region of the stair-step form, wherein
the first dummy channel structure and the fourth dummy channel structure are disposed in a first row,
the second dummy channel structure and the fifth dummy channel structure are disposed in a second row, and
the third dummy channel structure is disposed between the first row and the second row.

3. The semiconductor device of claim 1, wherein
the first contact structure is disposed over the first stair region at a distance from the third dummy channel structure that is greater than a distance between the first dummy channel structure and the first contact structure, and
the second contact structure is disposed over the second stair region at a distance from the third dummy channel structure that is greater than a distance between the second dummy channel structure and the second contact structure.

4. The semiconductor device of claim 1, wherein the first contact structure and the second contact structure are conductively connected to a first gate layer and a second gate layer in the plurality of gate layers, respectively.

5. The semiconductor device of claim 1, wherein a minimum distance between each dummy channel structure and each contact structure is greater than or equal to a first limit.

6. The semiconductor device of claim 1, wherein a maximum distance between two neighboring dummy channel structures is less than or equal to a second limit.

7. The semiconductor device of claim 1, wherein the channel structure and the third dummy channel structure are formed of a same material.

8. The semiconductor device of claim 1, wherein the third dummy channel structure has a circular shape.

9. The semiconductor device of claim 1, wherein the third dummy channel structure is disposed between the first dummy channel structure and the second dummy channel structure.

10. The semiconductor device of claim 1, wherein the first dummy channel structure is neighboring to the first contact structure and the second dummy channel structure is neighboring to the second contact structure.

* * * * *